(12) United States Patent  
Carras et al.

(10) Patent No.: US 7,567,606 B2
(45) Date of Patent: Jul. 28, 2009

(54) STRONG DISTRIBUTED FEEDBACK SEMICONDUCTOR LASER

(75) Inventors: Mathieu Carras, Gentilly (FR); Alfredo De Rossi, Paris (FR)

(73) Assignee: Thales (FR)

( * ) Notice: Subject to any disclaimer, the term of this patent is extended or adjusted under 35 U.S.C. 154(b) by 0 days.

(21) Appl. No.: 12/117,780

(22) Filed: May 9, 2008

(65) Prior Publication Data

US 2008/0279233 A1 Nov. 13, 2008

(30) Foreign Application Priority Data

May 11, 2007 (FR) .................... 07 03389

(51) Int. Cl.
*H01S 5/00* (2006.01)
(52) U.S. Cl. .................... 372/50.11; 372/50.1
(58) Field of Classification Search ............. 372/50.1, 372/26, 43.01; 369/44.14
See application file for complete search history.

(56) References Cited

U.S. PATENT DOCUMENTS

| | | | | |
|---|---|---|---|---|
| 5,340,637 | A * | 8/1994 | Okai et al. ................. | 428/167 |
| 6,647,048 | B2 * | 11/2003 | Evans ....................... | 372/50.11 |
| 2002/0136255 | A1 * | 9/2002 | Takayama et al. ........... | 372/45 |

FOREIGN PATENT DOCUMENTS

| | | |
|---|---|---|
| EP | 0 877 454 | 11/1998 |
| EP | 1 137 133 | 9/2001 |
| FR | 2 893 184 | 5/2007 |

OTHER PUBLICATIONS

Rast, A. et al. "New Complex-Coupled DFB-Laser with a Contacted Surface Grating For L=1.58 MM." IEEE Proceedings: Optoelectronics, Institution of Electrical Engineers, Stevenage, GB, vol. 142, No. 3, Jun. 1, 2995, pp. 162-164, XP000520441, ISSN: 1350-2433.

Zhang, X et al. "GAAS/GAALAS Integrated Twinguide DFB BCRW Lasers With First-Order Contacted Surface Grating." Electronics Letters, IEEE Stevenage, GB, vol. 28, No. 4, Feb. 13, 1992, pp. 422-424, XP000248767, ISSN: 0013-5194.

(Continued)

*Primary Examiner*—Armando Rodriguez
*Assistant Examiner*—Tuan N. Nguyen
(74) *Attorney, Agent, or Firm*—Lowe Hauptman Ham & Berner, LLP

(57) ABSTRACT

The present invention relates to a strong distributed feedback semiconductor laser. More specifically, the invention implements a top optical waveguide (2) for semiconductor lasers having a surface metallic grating (5) making it possible to obtain a stable and controlled distributed feedback, using a simple and robust technology. In the inventive laser, which comprises an active area (1) having an effective refractive index (neff) in which a light wave is propagated with a wavelength ($\lambda$), the top waveguide (2) is made of a weakly-doped material and the periodic grating (5) depth (p) is $$\left[\frac{\lambda}{4 \times neff}\right]$$

plus or minus 50%, the low precision needed being one of the advantages of the inventive laser.

10 Claims, 3 Drawing Sheets

OTHER PUBLICATIONS

Rast, A. et al. "Room-Temperaute CW Operation of =1.55UM INGAAS/INP ITG-DFB-BCRW Lasers With Contacted Surface Grating." Electronics Letters, IEE Stevenage, GB, vol. 27, No. 10, May 9, 1991, pp. 808-809, XP000230458, ISSN: 0013-5194.

Rast, A. A Novel INGAASP/INP Distributed Feedback Laser With A Contacted Surface Grating For =1.55 M: Archiv Fur Elektronik UND Ubertragungstechnik, S.Hirzel Verlag. Stuttgart, DE, vol. 43, No. 6, Nov. 1, 1989, XP000080268, ISSN: 0001-1096.

Carras, Mathieu et al. "Photonic Modes of Metallodielectric Periodic Waveguides in the Midinfrared Spectral Range." Physical Review B 74, 235120, 2006, pp. 235120-1.

* cited by examiner

STRONG DISTRIBUTED FEEDBACK SEMICONDUCTOR LASER

RELATED APPLICATIONS

The present application is based on, and claims priority from, French Application Number 07 03389, filed May 11, 2007, the disclosure of which is hereby incorporated by reference herein in its entirety.

TECHNICAL FIELD

The present invention relates to a distributed feedback semiconductor laser. More specifically, the invention implements an optical waveguide for semiconductor lasers having a surface metallic grating making it possible to obtain a stable and controlled distributed feedback, using a simple and robust technology.

BACKGROUND OF THE INVENTION

It is known that the first objective of distributed feedback is to maximize the elimination of the laser's secondary modes. A second objective is generally to reduce the mirror losses, that is, the losses due to the finite length of the laser cavity.

Currently, there are two main technologies for producing distributed feedback (DFB) lasers.

These two known technologies are on the one hand the use of buried gratings, in order to produce an index modulation, and on the other hand the use of surface metallic gratings, in order to produce a gain modulation.

The so-called "buried grating" technology consists in etching a periodic grating of notched thickness after growing the active area of the semiconductor laser. Then, the top layer of the laser waveguide is produced by a new step of growth on the grating. This technology introduces an index coupling because the wave being propagated in the active area perceives a modulation of the effective index of the cavity which changes with the thickness. It makes it possible to obtain a strong distributed feedback without degrading the laser threshold, that is, without introducing additional loss.

The main drawback of this technology is that it entails interrupting the growth between the active area and the waveguide in order to etch the grating then to carry out a new epitaxial growth step. This step is technologically difficult to perform, notably because an epitaxy must be performed on the grating, therefore on a surface that is not perfectly flat. Furthermore, the distributed feedback performance levels are very sensitive to the profile of the etching of the grating in the semiconductor layer close to the active area; any variation of the etching depth directly influences the grating's coupling coefficient. This makes the feedback difficult to control.

The second known technology for producing distributed feedback lasers is the "metallized surface grating" technology. This technology makes it possible to produce a gain coupling (or loss coupling). The object here is to grow all the layers of the laser: active area, waveguides and contact layers. A pattern is then etched in the top waveguide, then metallized. Compared to the buried grating technology, this technology presents the advantage that the steps introducing the distributed feedback, in particular the etching of the pattern in the top waveguide, are carried out after the growth of all the layers. It is therefore simpler to implement. On the other hand, its main defect is that the distributed feedback is obtained by loss modulation. This introduces additional losses, increasing the laser threshold and therefore degrading the laser's performance. Furthermore, the distributed feedback is, as with the buried grating technology, difficult to control because it is very sensitive to the accuracy of the etched pattern. Finally, the distributed feedback that is obtained is also linked to the optical losses introduced by the metal and the constituent materials of the waveguide, which constitutes another parameter that is difficult to control.

To sum up, the existing technologies for developing distributed feedback lasers are generally difficult to implement and to control and can degrade the laser's performance.

It should be noted, however, that preference is ideally given to index modulation lasers which, despite their being difficult to implement, present lower losses than loss modulation lasers.

SUMMARY OF THE INVENTION

In this context, the present invention proposes a new type of distributed feedback laser that uses index modulation and is based on a technology that is easier than those of the prior art. Thus, the technology that is to be described below makes it possible to produce strong distributed feedback lasers; it is technologically simple to implement and to control, and does not affect the laser's performance levels.

To this end, the subject of the invention is a semiconductor laser comprising at least:

a substrate providing the mechanical support function, an active area having a first intrinsic refractive index n1 and an effective refractive index neff, in which a light wave may be propagated with a wavelength λ designed for lasing, a top waveguide having a second intrinsic refractive index n2 and a thicknessed, and, on the surface, a grating structure at least partially covered by a layer of material, the dielectric permittivity of which presents a negative real part, such as, for example, metal, said grating having a period Λ and a depth p, a bottom waveguide having a third intrinsic refractive index n3, characterized in that:

the depth p of said grating is between approximately $$\left[0.5 \times \frac{\lambda}{4 \times neff}\right]$$

and approximately $$\left[1.5 \times \frac{\lambda}{4 \times neff}\right],$$

so as to introduce a modulation of the effective index of the active area making it possible to obtain a stable and controlled feedback.

Advantageously, the top waveguide is produced in an intrinsic or weakly-doped semiconductor material to introduce a variation of the intrinsic refractive index of the constituent material of said top waveguide that is less than approximately 10%.

Advantageously, the laser also comprises a thin layer of strongly-doped semiconductor material on the surface of the top waveguide providing an ohmic contact function.

Advantageously, the strongly-doped layer has a thickness that may be less than approximately 100 nm.

Advantageously, the depth of the periodic grating is approximately 0.5 μm.

Advantageously, the substrate is made of InP, or of GaAs, or of GaSb, or of InAs, or of Si.

Advantageously, the bottom waveguide is made of a strongly-doped semiconductor material.

Advantageously, the bottom waveguide is made of InP.

Advantageously, the top waveguide is made of InP, or of InGaAs, or of AlGaAs.

Advantageously, the active area is a stack of thin layers: GaAs and AlGaAs, or AlInAs and GaInAs, or InAs and AlSb.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
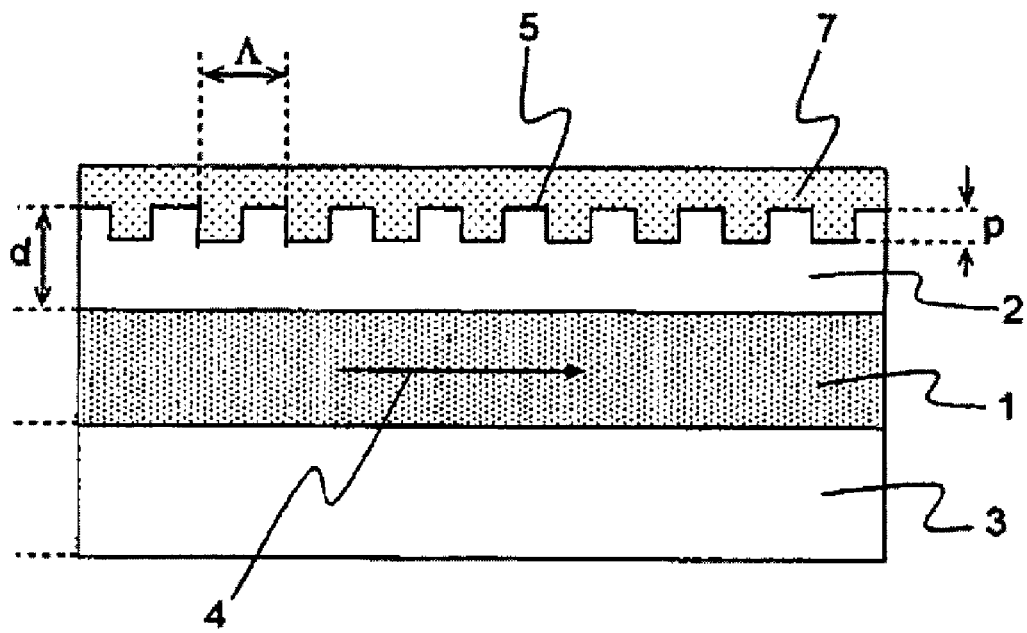
FIG. 1: a diagrammatic illustration of a first exemplary laser according to the invention.

FIG. 1 is a simplified diagram of the laser according to the invention. The key lies in understanding the physical phenomena that occur in the laser and how to control them.

In practice, in the inventive laser, thanks to an appropriate stack of layers forming the active area 1, and thanks to a top waveguide 2 consisting of a non-doped or weakly-doped (that is, introducing a variation of the refractive index less than 10%) semiconductor material, a coupling is obtained between the surface waves, also called plasmons, of the metal structure 7 which covers the grating 5 located above the top waveguide 2 and the modes guided by the semiconductor layers 2 and 3. This coupling introduces an index modulation without additional loss. This physical phenomenon is described in the document by M. CARRAS and A. DE ROSSI entitled "Photonic modes of metallodielectric periodic waveguides in the midinfrared spectral range", Physical Review B, 74, 235120 (2006). Moreover, the French patent 2 893 184 describes a use of the properties of the surface plasmons in the context of an optical structure for locating an electromagnetic field. To be effective, the periodic grating 5 etched on the surface of the top waveguide 2 of the laser needs to have an appropriate depth p, of approximately $$\left[\frac{\lambda}{4 \times neff}\right],$$

for a light wave 4 being propagated at the wavelength λ in the active area 1 of the laser having an effective refractive index neff.

Figure 2:
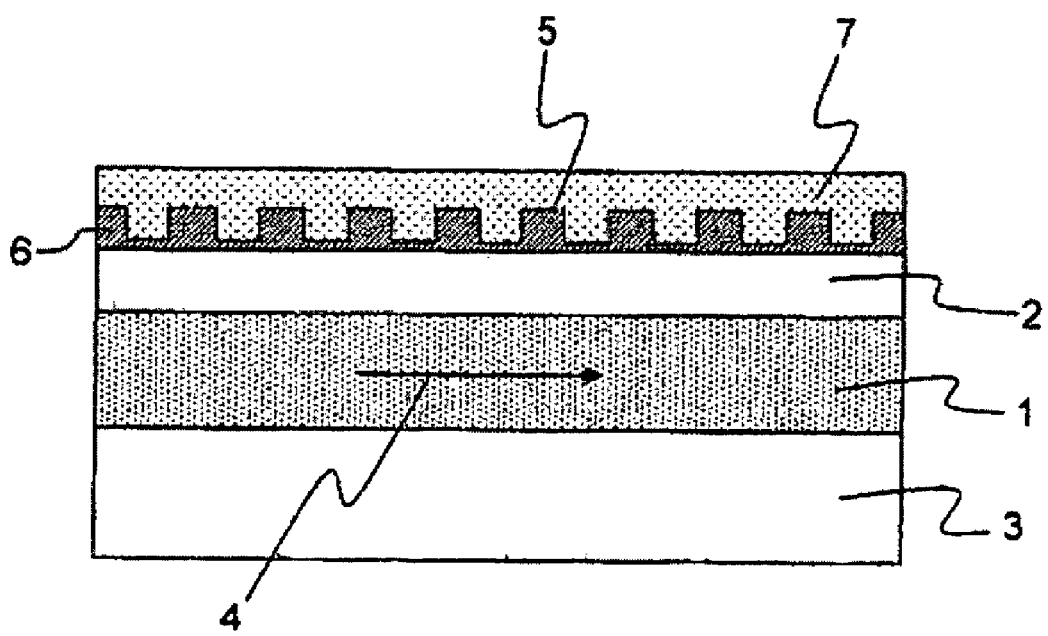
FIG. 2: the diagram of a second exemplary laser according to the invention.

FIG. 2 illustrates a second exemplary laser according to the invention. This other example is very close to that of FIG. 1, but it also incorporates a very thin layer of strongly-doped material 6 on the surface of the top waveguide 2. This layer provides only the ohmic contact function. This is a major difference from the current lasers including a metallic surface grating. In practice, the latter normally have a thick, strongly-doped dielectric layer, called "plasmon layer", for optimizing the loss coupling. In the inventive laser, this "plasmon layer" is absent and its presence would even be detrimental.

However, while the inventive laser can preferably, but not necessarily, contain a layer of strongly-doped dielectric material 6, the latter must be very thin, with a thickness of the order of less than 100 nm.

In this case, the periodic grating 5 is etched in the layer of strongly-doped dielectric material 6, the bottom of the grating possibly, but not necessarily, reaching the non-doped layer forming the base of the top waveguide 2 (in FIG. 2, by way of example, the grating remains contained in the layer 6).

The inventive laser therefore makes it possible to produce an index coupling, without the need to use the buried grating technology, that is without needing to resume epitaxial growth. Moreover, no additional loss is introduced, unlike what occurs with the current lasers that include a metallic surface grating.

EXEMPLARY EMBODIMENT

Figure 3:
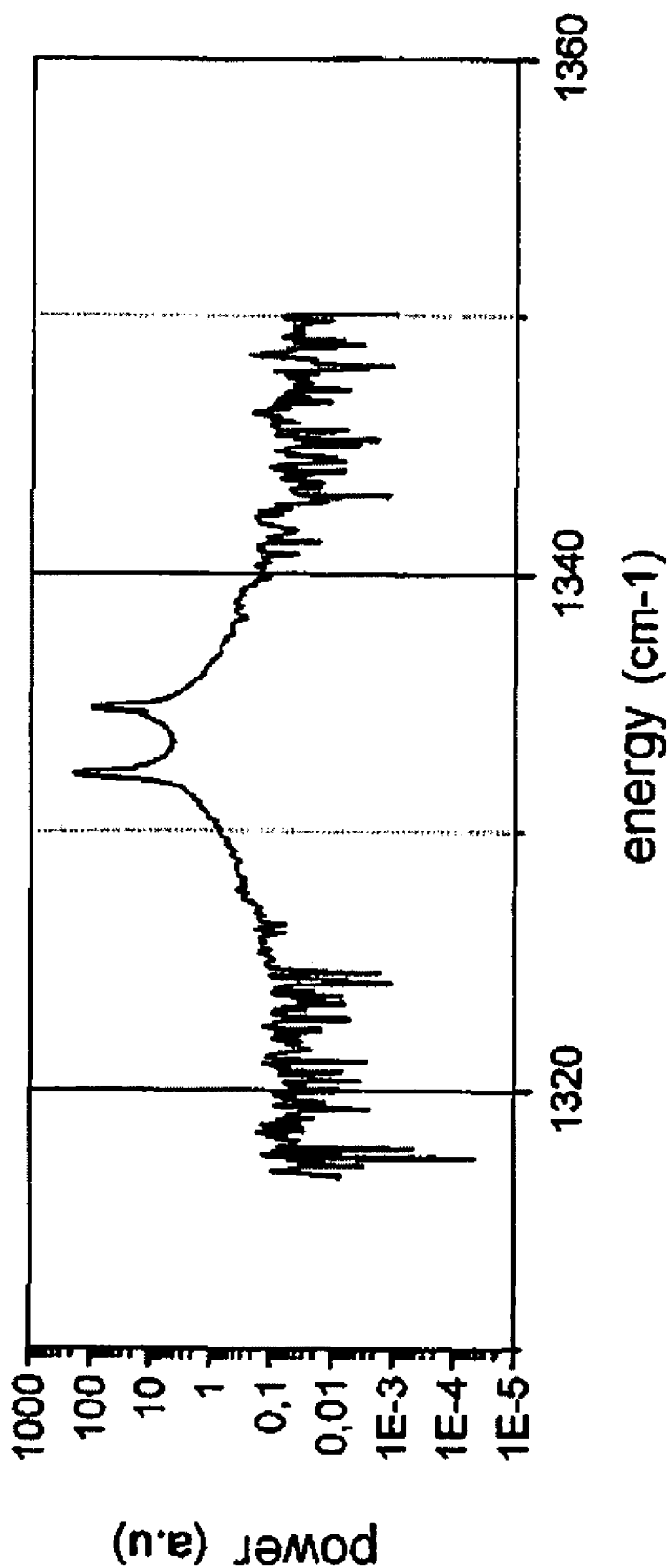
FIG. 3: the spectrum of a laser produced according to the invention.

FIG. 3 shows the spectrum of a laser according to the invention. In this example, according to the diagram in FIG. 1, the periodic grating 5, surface etched on the top waveguide 2 and metallized, has a depth of approximately 0.5 µm and a period of approximately 1.25 µm. The light wave 4 lases at a wavelength of approximately 8 µm. The bottom and top waveguides 3 and 2 are of non-doped InP and the active area is formed by a stack of thin AlInAs and GaInAs layers.

In these conditions, the laser spectrum of FIG. 3 shows two peaks centred on the edge wavelengths of the prohibited band. These are the two predominant modes of this laser; the losses are equivalent on both modes, which clearly shows that a modulation of the effective index of the active area 1 has been produced.

Figure 4:
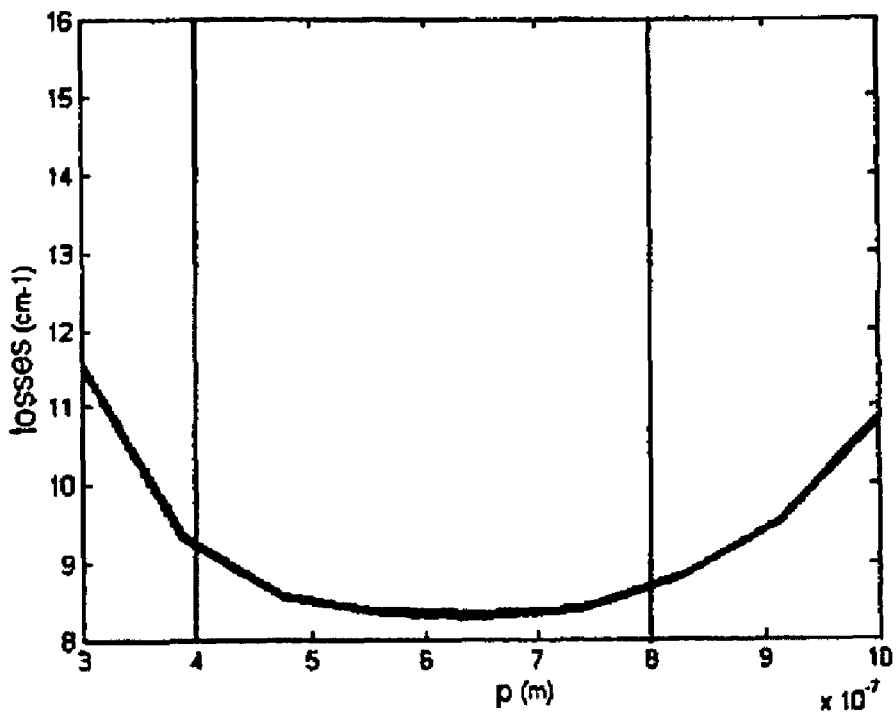
FIG. 4: the trend curve of the losses of the band edge modes of the laser according to the depth p of the etched periodic grating.
Figure 5:
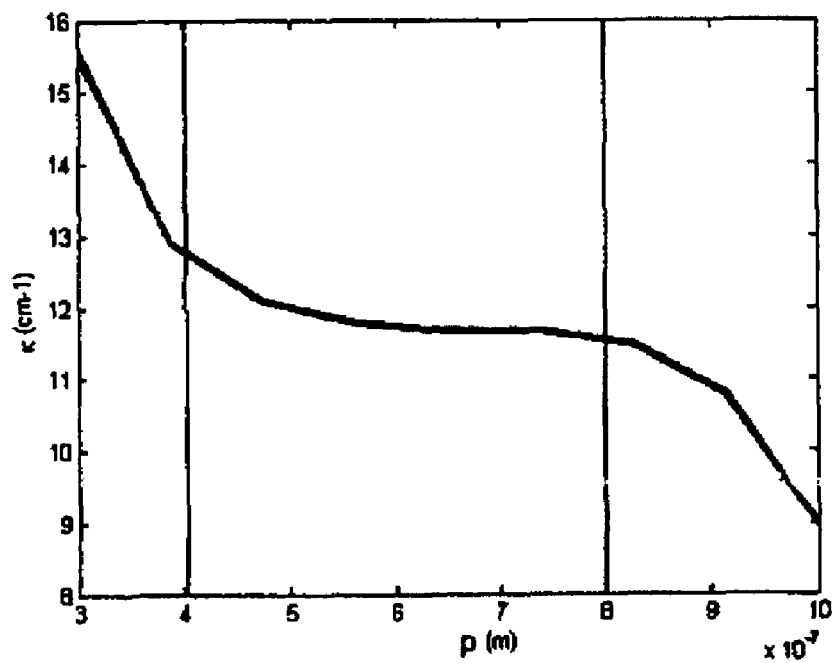
FIG. 5: the trend curve of the coupling coefficient K as a function of the depth p of the etched periodic grating.

FIGS. 4 and 5 illustrate the robustness of the technology for producing distributed feedback (DFB) lasers according to the invention, and in particular the low dependency of the coupling coefficient of the grating K with respect to the etching precision of the depth p of the periodic grating 5. To produce these curves, two periodic gratings 5 of different depths p have been etched on the surface of the top waveguide 2 of lasers according to the invention as diagrammatically represented in FIG. 1. Systematically, the bottom and top waveguides 3 and 2 were of InP, and the active area 1 was a stack of thin AlInAs and GaInAs layers. The period of the grating 5 is approximately 1.25 µm and the wavelength of the light wave (4) is approximately 8 µm.

FIG. 4 highlights the fact that the losses of one of the guided modes shows almost no variation with a depth p of the grating 5 that varies from 0.4 µm to 0.8 µm; regarding the depth p, this constitutes an etching precision that is easy to achieve with the current standard machines.

FIG. 5 demonstrates that the coupling coefficient K varies by scarcely 10% over the same range of variation of the depth p of the grating 5.

On the other hand, in order to control the coupling coefficient K of the grating, it can be noted that the latter is higher when the thickness of the top waveguide is lower, and vice versa.

To sum up, the main advantage of the invention is that it makes it possible to produce index modulation-based distributed feedback (DFB) lasers in a way that is technologically simple to implement and control.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. Semiconductor laser comprising:
   a substrate providing the mechanical support function,
   an active area having a first intrinsic refractive index and an effective refractive index, in which a light wave is propagated with a wavelength λ designed for lasing,
   a top waveguide having a second intrinsic refractive index and a thickness, and, on the surface, a grating structure at least partially covered by a layer of material, the dielectric permittivity of which presents a negative real part, such as, for example, metal, said grating having a period and a depth,
   a bottom waveguide having a third intrinsic refractive index,
   wherein:
   the depth of said grating is between approximately $$\left[0{,}5 \times \frac{\lambda}{4 \times neff}\right]$$

and approximately $$\left[1{,}5 \times \frac{\lambda}{4 \times neff}\right],$$

so as to introduce a modulation of the effective index of the active area making it possible to obtain a stable and controlled feedback.

2. Laser according to claim 1, wherein the top waveguide is produced in an intrinsic or weakly-doped semiconductor material to introduce a variation of the intrinsic refractive index of the constituent material of said top waveguide that is less than approximately 10%.

3. Laser according to claim 1, comprising a thin layer of strongly-doped semiconductor material on the surface of the top waveguide providing an ohmic contact function.

4. Laser according to claim 3, wherein the strongly-doped layer has a thickness less than approximately 100 nm.

5. Laser according to claim 1, wherein the depth of the periodic grating is approximately 0.5 μm.

6. Laser according to claim 1, wherein the substrate is made of InP, or of GaAs, or of GaSb, or of InAs, or of Si.

7. Laser according to claim 1, wherein the bottom waveguide is made of a strongly-doped semiconductor material.

8. Laser according to claim 1, wherein the bottom waveguide is made of InP.

9. Laser according to claim 1, wherein the top waveguide is made of InP, or of InGaAs, or of AlGaAs.

10. Laser according to claim 1, wherein the active area is a stack of thin layers:
    GaAs and AlGaAs,
    or AlInAs and GaInAs,
    or InAs and AlSb.

* * * * *